United States Patent [19]

Nishigaki et al.

[11] Patent Number: 4,621,066
[45] Date of Patent: Nov. 4, 1986

[54] LOW TEMPERATURE FIRED CERAMICS

[75] Inventors: Susumu Nishigaki; Shinsuke Yano; Shirohito Matsuyama, all of Nagoya, Japan

[73] Assignee: Narumi China Corporation, Nagoya, Japan

[21] Appl. No.: 716,722

[22] Filed: Mar. 27, 1985

[30] Foreign Application Priority Data

Jun. 1, 1984 [JP] Japan .................. 59-110973

[51] Int. Cl.$^4$ .................. C04B 35/02; C03C 10/06
[52] U.S. Cl. .................. 501/128; 501/2; 501/8; 501/125
[58] Field of Search .......... 501/2, 8, 128, 125

[56] References Cited

U.S. PATENT DOCUMENTS 3,471,306 10/1969 Rubin et al. .................. 501/125
3,847,582 11/1974 Kozmin .................. 501/8
3,923,528 12/1975 Kume .................. 501/2
4,187,115 2/1980 Reade .................. 501/8
4,522,926 6/1985 Felice .................. 501/128

FOREIGN PATENT DOCUMENTS 2460931 9/1975 Fed. Rep. of Germany .
50-119814 9/1975 Japan .

Primary Examiner—William R. Dixon, Jr.
Assistant Examiner—Steven Capella
Attorney, Agent, or Firm—Flynn, Thiel, Boutell & Tanis

[57] ABSTRACT

Low temperature fired ceramics produced by firing at a low temperature a mixture consisting of, in weight percentages:

(a) 50 to 65% of powder glass consisting of 10 to 55% of CaO, 45 to 70% of $SiO_2$, 0 to 30% of $Al_2O_3$ and up to 10% of impurities; and (b) 50 to 35% of powder $Al_2O_3$ containing up to 10% of impurities. The glass component (a) may further contains $B_2O_3$ up to 20% based on the total weight of the former glass-forming components. The ceramics exhibit excellent thermal conductivity, high mechanical strength, low thermal expansion and small dielectric constant and such advantageous combination of properties make them useful in many applications, more especially highly suited to the use as substrate of various electronic parts, components or multilayer integrated circuits. Also, since the ceramics can be prepared at lower firing temperatures and a higher heating rate, the production cost and time can be advantageously saved.

8 Claims, 7 Drawing Figures

Glass Powder of Specimen No.3 fired at 900°C

Specimen No.3 fired 850°C (60% of Glass Powder and 40% of Alumina Powder)
C: Alumina Specimen No.3 fired at 900°C (60% of Glass Powder and 40% of Alumina Powder)
A : Anorthite Specimen No.22 fired at 850°C (55% of Glass Powder and 45% of Alumina Powder)
D: Calcium Silicate

LOW TEMPERATURE FIRED CERAMICS

BACKGROUND OF THE INVENTION

The present invention relates to low temperature fired ceramics especially useful in the manufacture of electronic components or parts and further, useful in other various applications, such as heat-resistance industrial articles, tablewares, kichen utensils and decorative articles.

Recently, there has been a growing demand for a more densely integrated electronic circuits with the increasing trend toward miniaturization of computers or electronic devices of various equipment or facilities for public-utility. In such circumstances, substrates must satisfy the following requirements.
(1) Low cost
(2) Light weight
(3) High mechanical strength
(4) The substrates have a high thermal conductivity, thereby allowing rapid radiation of generated heat.
(5) In order to increase the density of a two-dimensional wiring, wiring with a conductor width of 150 μm or finer can be performed.
(6) The substrate sheets can be readily stacked in a multilayer configuration and thereby permit a three-dimensional wiring with an increased density.
(7) Passive parts, such as inductors, resistors or capacitors, can be integrally incorporated into the substrate during stacking the substrate sheet in a multilayer configuration.
(8) In order to minimize an electrostatic capacity between conductors, thereby to realize a rapid response to signals, their dielectric constant must be as small as possible.
(9) For the requirement (8), conductive materials with a low electrical resistance, for example, Ag, Ag-Pd, Cu, Au, can be employed.
(10) The dielectric layers have a small coefficient of thermal expansion near that of a Si semiconductor with a thermal expansion coefficient of $3.5 \times 10^{-6}/°C$. to be packaged thereon, thereby permitting a direct bonding of semiconductor chips thereto.
(11) Electrical resistivity between wires printed thereon is high.
(12) They are not adversely affected by temperature, humidity or other atmospheric conditions and have high stability properties.

Heretofore, for the above mentioned purposes, various organic multilayer substrates or alumina ceramic multilayer substrates have been employed. However, these conventional substrates are superior in some properties, but in other properties, they are inferior. Therefore, any substrate heretofore available can not give satisfaction in all respects and presents problems or difficulties in practical applications.

More specifically, in the case of organic multilayer substrates, circuits are formed on copper cladding layers bonded onto both sides of phenol resin or epoxy resin substrate sheets, then the resin sheets are bonded to form a multilayer configuration by using epoxy resin adhesives and through holes are formed between the conductors by a mechanical perforating process. However, the organic resin multilayer substrates thus fabricated have the following problems:
(1) The substrates are subjected to warpage and cracking during repeated soldering or dip brazing operations because of their poor heat resistance, low strength and unfavorably excess thermal expansion coefficient of the order of $50 \times 10^{-6}/°C$. and further their electrical resistivity will be detrimentally affected due to elevated temperature exposure.
(2) When elements, such as resistors or semiconductor IC chips, which tend to generate heat, are packaged on the conventional organic resin substrates, various special consideration or designs, for example, an enlarged bonding area for the elements or the use of radiating sheets, are required in order to prevent the elements from being heated up beyond acceptable temperature levels.
(3) In the fabrication of multilayer structures, it is very difficult to form fine conductors with a width of 150 μm or finer or numbers of through holes with a diameter of smaller than 200 μm.
(4) Reliability in heat or humidity stability is low.

On the other hand, multilayered alumina substrates have the following disadvanteges:
(1) They are manufactured at a very high temperature of 1600° to 1700 ° C. in an atmosphere of hydrogen and such special conditions considerably increase production cost compared with the former organic resin multilayer substrates.
(2) Since W or Mo is employed as conductive materials, resistance of the conductors is high.
(3) They exhibit a large density (from 3.8 to 3.9 g /cm$^3$) as compared to that of the organic resin subtstrate (2.0 g/cm$^3$).
(4) Their dielectric constant (9 to 10 at 1 MHz) is high as compared to the dielectric constant of the former organic substrates (3 to 5 at 1 MHz).
(5) Although they exhibit an appreciably lowered thermal expansion compared with the former organic substrate, their thermal expansion coefficient of $7.0 \times 10^{-6}/°C$. (from room temperature to 250° C.) is too large as compared to that of Si semiconductor.

In view of the above circumstances, there have been proposed several low temperature fired glass ceramic compositions.

As examples of low temperature fired ceramics, low temperature fired ceramics using crystallized glass are presented in some reports. For example, for the purpose of obtaining lower temperature fired ceramics with a high strength, MgO-Al$_2$O$_3$-SiO$_2$ base composition containing additives of B$_2$O$_3$ and nucleating agent are fired at a temperature of 900° to 1000 ° C. to precipitate crystallites of cordierite in the resulting ceramics.

For the same purpose, there have been reported as other examples lower temperature fired ceramics produced from Li$_2$O-Al$_2$O$_3$-SiO$_2$ base compositions with additives of B$_2$O$_3$ and nucleating agent. In this composition, in order to increase the strength of the fired products, spodumene is precipitated. In general, in order to make ceramics at lower firing temperatures, glass phase is required to be contained in much larger quantities. However, in the case, it is very difficult to achieve a high strength of 1800 kg/cm$^2$ or higher. In either the case of MgO-Al$_2$O$_3$-SiO$_2$ or Li$_2$-Al$_2$O$_3$-SiO$_2$, low temperature fired ceramics with a high strength are attained by precipitating high strength crystals therein by heat treating. However, in the cases of these known ceramic compositions, the aimed crystals do not precipitate below 900° C. and the compositions are in a glassy phase in the vicinity of 500° C. to about 800° C. Thus, when fine conductor patterns are printed onto green ceramic tapes and fired simultaneously together with the ceramics, the printed patterns tend to flow and deform. Therefore, great difficulty will be presented in the formation of circuits with a high precision. Further, another difficulty may be encountered in firing process. When green ceramic tapes containing a large amount of an organic binder are fired to remove the organic binder component, it is requested to fire the tapes so that the organic binder does not remain as carbon in the glass phase and, thus, firing should be carried out without softening the glass and while maintaining the porosity required to facilitate degassing. For such requirement, a heating rate in the firing step must be about 2° C. per minute and, as shown in FIG. 1, it takes eight hours to heat up 950° C.

Further, there is reported low temperature fired ceramics using a mixture of a noncrystallized glass and insulating or refractory oxides. The examples are a borosilicate glass ($B_2O_3$-$SiO_2$) containing additives of refractory materials, such as cyanite or anorthite, or a mixture of lead borosilicate glass ($B_2O_3$-$SiO_2$-$PbO$-$Al_2O_3$) and insulating oxides, such as forsterite and $ZrO_2$. These ceramics also, as in the case of low temperature fired ceramics using crystallized glasses previously set forth, can not successfully form circuits in a high resolution due to liability to flowing of patterns and consume a very long firing time of 12 to 18 hours to heat to 900° C. due to a slow heating rate of the order of 1° C. per minute, as shown in FIG. 1. Further, in the cases of the noncrystallized glasses, since it is impossible to obtain a required strength level only from the noncrystallized glasses, refractory materials are added to the noncrystallized glasses in order to achieve an acceptable strength level in the composite systems of the noncrystallized glasses and the added refractory materials. However, the noncrystallized glass phase does not crystallized even in a final firing stage at 800° to 1000° C. The noncrystallized glass phase softens during firing and causes deformation of patterns. Further, softening of the glass makes degassing very difficult and, thus, the binder component is required to be slowly driven off by firing for a very long time at temperatures below the softening temperature of the glass. FIG. 2 shows shrinkage curves of various low temperature fired ceramics. As can be seen from this figure, in both cases of crystallized glass and noncrystallized glass with addition of refractory materials, shrinkage due to softening of glass (noncrystallized or crystallized glass) is observed at temperatures of 200° to 700° C.

SUMMARY OF THE INVENTION

Therefore, it is an object of the present invention to provide low temperature fired ceramics having an advantageous combination of properties of excellent heat resistance, high mechanical strength, low thermal expansion and low dielectric constant and thereby especially suited for use in electronic components and useful as ceramic materials for other various applications.

One aspect of the present invention resides in low temperature fired ceramics produced by firing at a low temperature a mixture consisting of, in weight percentages:
 (a) 50 to 65% of powder glass consisting of 10 to 55% of CaO, 45 to 70% of $SiO_2$, 0 to 30% of $Al_2O_3$ and up to 10% of impurities; and
 (b) 50 to 35% of powder $Al_2O_3$ containing up to 10% of impurities.

In another aspect, the present invention resides in further low temperature fired ceramics produced by firing at a low temperature a mixture consisting of, in weight percentages:
 (a) 50 to 65% of powder glass consisting of
  (i) 10 to 55% of CaO, 45 to 70% of $SiO_2$, 0 to 30% of $Al_2O_3$ and up to 10% of impurities; and
  (ii) up to 20% based on the total weight of the former components (i) of $B_2O_3$; and
 (b) 50 to 35% of powder $Al_2O_3$ containing up to 10% of impurities.

Throughout this specification, percentages are all indicated by weight, unless otherwise specified.

DETAILED DESCRIPTION OF THE PREFERRED EMBODIMENTS

According to the first aspect of the present invention, low temperature fired ceramics having a combination of highly improved properties that make them especially very useful as electronics materials are produced by firing at low temperatures a mixture consisting of, in weight percentages:
 (a) 50 to 65% of finely divided glass composed of 10 to 55% of CaO, 45 to 70% of $SiO_2$, 0 to 30% of $Al_2O_3$ and up to 10% impurities; and
 (b) 50 to 35% of finely divided $Al_2O_3$ containing up to 10% of impurities.

Alternatively, the glass component of the present invention may further contains $B_2O_3$ in an amount of up to 20% based on the total weight of the foregoing glass components including the impurities.

The reason why the present invention employs as glass-forming components CaO, $SiO_2$, $Al_2O_3$ and, if necessary, further $B_2O_3$ is that the glass made up of such components is not reduced by firing in an atmosphere containing nitrogen as main component. The nitrogen firing atomsphere is employed when Cu is employed as conductors. Thus, the ceramic materials of the present invention can be employed in any firing atmosphere of oxidizing, reducing or inert atmosphere.

The glass may contains as impurities from 0 to 5% of alkali metals, such as $Na_2O$ or $K_2O$ and other oxides, for example, MgO, BaO, PbO, $Fe_2O_3$, $MnO_2$, $Mn_3O_4$, $Cr_2O_3$, NiO, $Co_2O_3$, the maximum total amount of the impurities being limited to 10% based on the total weight of the glass forming components except $B_2O_3$.

The $Al_2O_3$ powder to be admixed with the glass powder may contain the same impurities as in the glass in a maximum total amount of 10%.

The low temperature fired ceramic according to the present invention is basically different from the conventional low temperature fired ceramics previously set forth in behavior or mechanism or process of sintering. The $CaO-Al_2O_3-SiO_2$ or $CaO-Al_2O_3-SiO_2-B_2O_3$ system noncrystallized glass is partially crystallized during the firing step by addition of $Al_2O_3$ and precipitates crystals of anorthite or anorthite+calcium silicate (wollastonite). Such partial crystallization not only makes possible firing at lower temparature of 800° to 1000° C. but also minimizes the deformation of fine patterns caused during firing step and makes possible rapid firing.

Figure 3A:
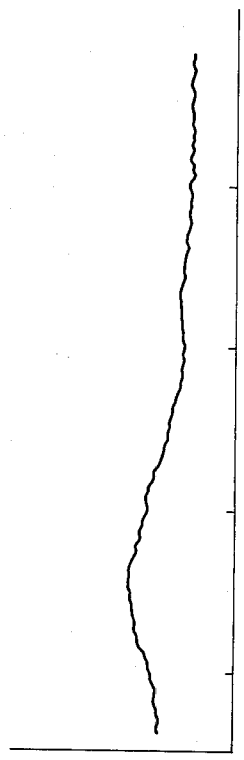
FIGS. 3(a) to 3(d) are the x-ray diffraction patterns of noncrystallized $CaO$-$Al_2O_3$-$SiO_2$-$B_2O_3$ glass and x-ray diffraction patterns showing the behaviors of the partial crystallization of the ceramics made from a mixture of $CaO$-$Al_2O_3$-$SiO_2$-$B_2O_3$ glass or $CaO$-$SiO_2$-$B_2O_3$ glass with $Al_2O_3$ in accordance with the present invention.
Figure 3B:
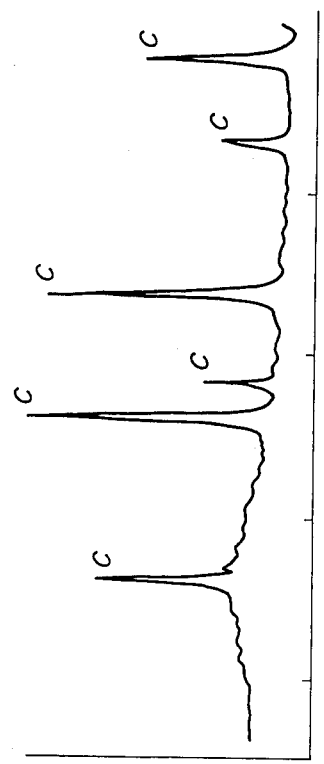
Figure 3:
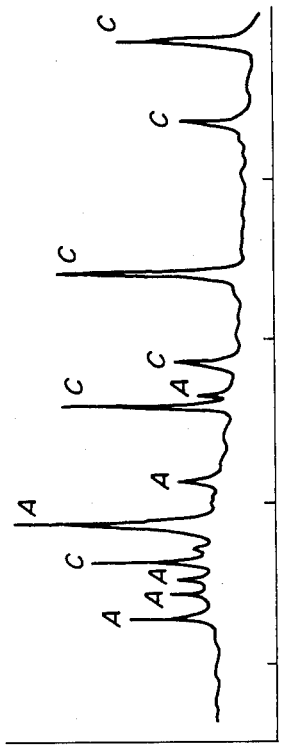
Figure 3:
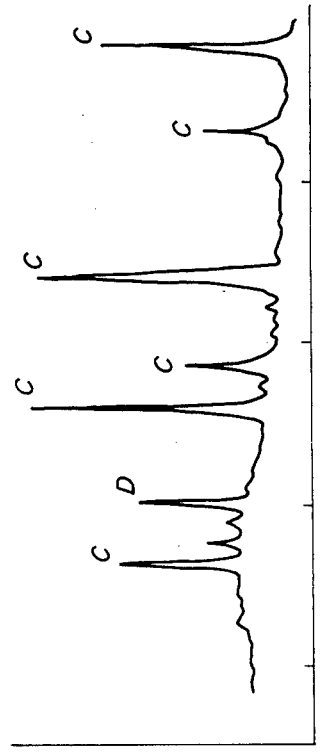

FIGS. 3(b) to 3 (d) evidently show the partial crystallization of the ceramics according to the present invention by X-ray diffraction. FIGS. 3(b) and 3(c) are the X-ray diffraction patterns of the sintered bodies of specimen No. 3 in Table given hereinafter which were made from $CaO-SiO_2-Al_2O_3-B_2O_3$ glass and $Al_2O_3$ powder and fired at 850° C. and 900° C., respectively, and FIG. 3(d) is for the sintered body of specimen No. 22 made from $CaO-SiO_2-B_2O_3$ glass and $Al_2O_3$ powder and fired 850° C. FIG. 3(a) is the X-ray diffraction pattern of $CaO-Al_2O_3-SiO_2-B_2O_3$ glass (glass composition of specimen No. 3) without an addition of $Al_2O_3$ powder which was subjected to a heat treatment at 900° C. and, as can be seen from this figure, crystallization was not detected at this low temperature firing as in the cases of other conventional $MgO-Al_2O_3-SiO_2$ or $Li_2O-Al_2O_3-SiO_2$ glass. However, as shown in FIGS. 3(b) and 3(c), addition of $Al_2O_3$ is found to precipitate anorthite crystals at $Al_2O_3$-glass interface of the resulting fired ceramics. Particularly, a large quantity of anorthite crystals are crystallized out by firing at 900° C. Further, as shown in FIG. 3(d), calcium silicate crystals may be also precipitated in some compositions. As set forth above, the raw materials for the law temperature fired ceramics of the present invention are mixtures made up of the specified noncrystallized glass compositions and alumina before fired, but after fired, the materials are converted into sintered products of partially crystallized ceramics comprising a noncrystallized glass phase, alumina and crystallized phase. When conventional low temperature fired ceramics with crystallized glass are produced, nucleating agents, such as $TiO_2$ or $ZrO_2$, are indispensably required. Whereas in the cases of the $CaO-Al_2O_3-SiO_2$ glasses used in the present invention, it is considered that $Al_2O_3$ acts as nuclei and dissolves in the glass phase to some extent, whereby forming the anorthite crystal.

Figure 1:
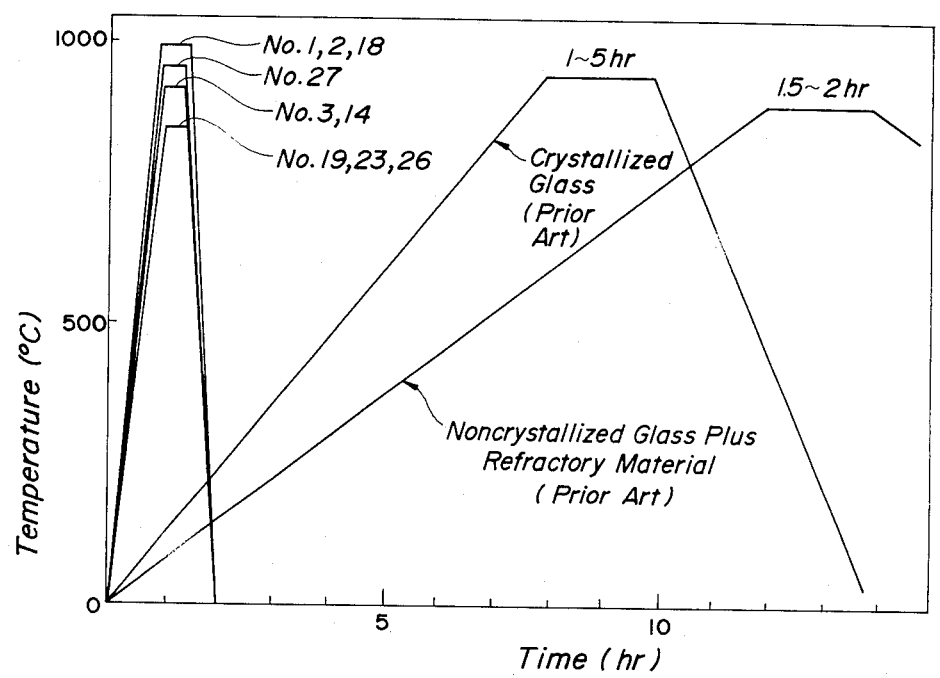
FIG. 1 is a time-temperature profile showing the heating curves for the present invention (Nos. 1, 2, 3, 14, 18, 19, 23, 26, 27) and the heating curves for low temperature fired ceramics heretofore available (crystallized glass and noncrystallized glass + refractory material).
Figure 2:
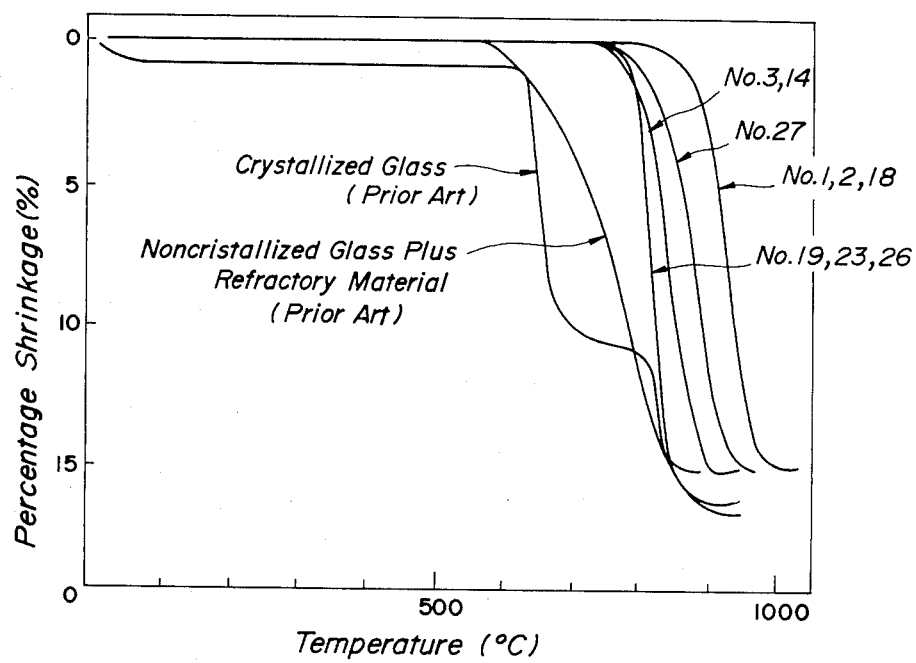
FIG. 2 is a percentage shrinkage-firing temperature curve for comparing low temparature fired ceramics of the present invention (Nos. 1, 2, 3, 14, 18, 19, 23, 26, 27) with conventional low temperature fired ceramics (crystallized glass and noncrystallized glass + refractory material).

Further, as is apparent from FIGS. 1 and 2, the low temperature fired ceramic compositions of the present invention are retained in a porous state up to the firing temperatures of 730° to 850° C. without softening and shrinking, even if heated at a rapid heating rate of the order of 30° to 50° C./min and thus binders used in the ceramics are readily removed from without any carbon component remaining in the glass phase or the formation of cracks. However, since the ceramics are rapidly shrunk and sintered by firing near the temperature range of 800° to 1000° C., a large-sized, dense ceramic substrate (for example, 30 cm×30 cm in size) can be readily obtained in a shortened time. Such rapid sintering ability is believed to be due to the partial crystallization of the low temperature fired ceramics of the present invention and the fact that any shrinkage does not occur due to firing until heated to 730° to 850° C.

The beneficial combination of partial crystallization and rapid shrinkage and sintering at high temperatures are characteristic behaviors in firing step of the mixture of $CaO-Al_2O_3-SiO_2(-B_2O_3)$ glass and $Al_2O_3$ powder of the present invention. Further, since, up to the temperature of 730° to 850° C., any shrinkage does not occur but, thereafter, at the final firing stage at higher temperature, partial crystallization rapidly takes place, flowing of glass is prevented and thereby fine patterns with a high precision can be readily obtained without causing any deformation. Therefore, the green ceramics multilayered, conductors, resistors, capacitors are simultaneously fired with a high precision configuration. Further, in addition to the advantage that the simultaneous firing can be performed without causing any deformation of patterns, $RuO_2$ resistor, Cu conductors or the like can be applied onto the fired ceramic substrate by conventional thick film printing techniques and fired without accompanying deformation of the multilayer ceramic structure or the circuit patterns previously fired onto the substrate by the simultaneous firing, by virtue of the partial crystallization caused by firing at 800° to 1000° C.

$B_2O_3$ of the second invention is employed in order to melt the glass forming materials near temperatures of 1300° to 1450° C. and retain the firing temperature of the aimed ceramics within the temperature range of 800° to 1000° C. without adversely affecting their electrical properties and mechanical or physical properties even if a large amount of $Al_2O_3$ is added. However, since an excess amount of $B_2O_3$ lowers the mechanical strength of the ceramics, glass compositions containing $B_2O_3$ in amount of more than 20% based on the total weight of the other glass-forming ingredients are impractical. Increasing $B_2O_3$ content tends to lower thermal expansion coefficient and dielectric constant.

Figure 4:
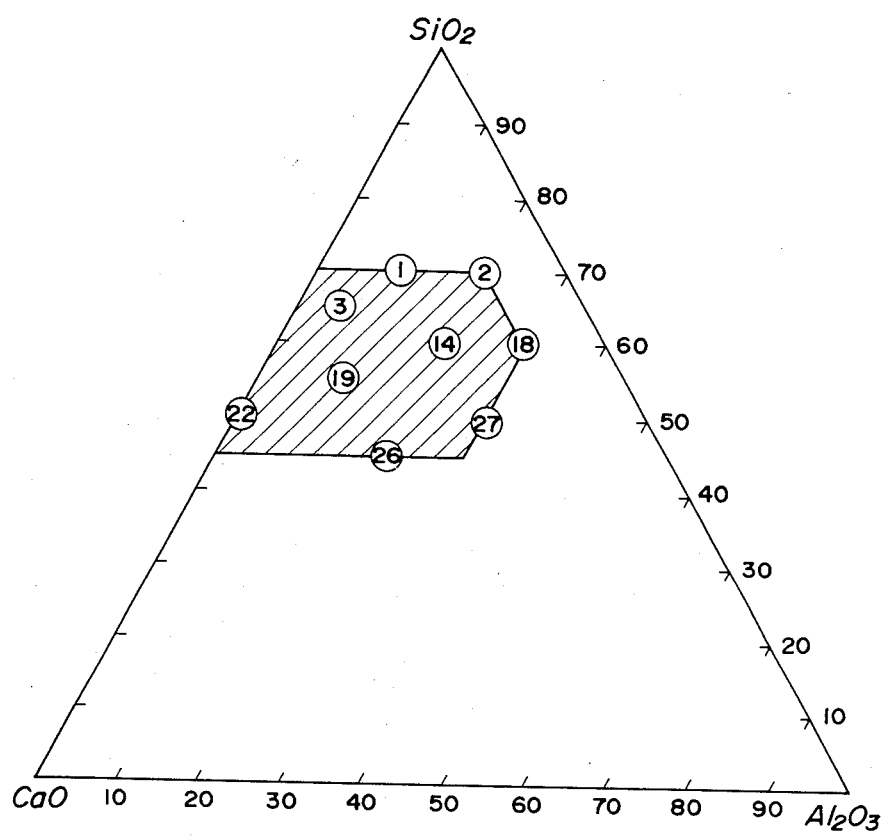
FIG. 4 is a graph showing the composition range of the glass of the present invention.

The composition range of glass employed in the present invention is shown in a shaded area of FIG. 4. The $SiO_2$ content should be in the range of 45 to 70%, since when the content of $SiO_2$ is below the specified range, dielectric constant and thermal expansion coefficient will be higher than their required levels, while an excess content above the range will present difficult in firing at temperatures of 1000° C. or lower. $Al_2O_3$ must be contained in the range of 0 to 30%. Higher contents exceeding 30% will make difficult to fire at temperature of 1000° C. or lower. The content of CaO should be in the range of 10 to 55%. With an insufficient content less than 10%, it is impossible to fire at temperatures of 1000° C. or lower, while an excess amount above 55% causes an unacceptable increase in dielectric constant and thermal expansion coefficient. The respective content ranges of $SiO_2$, $Al_2O_3$ and CaO above specified are all indicated based on the total weight of these glass-forming components and impurities except $B_2O_3$.

Further, with respect to $Al_2O_3$ powder to be added the foregoing glass powder component, the proportion of glass powder to $Al_2O_3$ powder should be required to be within the range of 50 to 65:50 to 35 in order to produce dense ceramics at a lower firing temperature of 800° to 1000° C.

The reason why the powdered $Al_2O_3$ content is limited to the range of 50 to 35% is that the content range is necessary to bring the firing temperatures of the ceramic within the range of 800° to 1000° C. and achieve the strength, thermal expansion, dielectric constant and volume resistivity contemplated by the present invention. An excess content of $Al_2O_3$ powder more than 50% tends to increase the thermal expansion coefficient and dielectric constant of the ceramics above the required level and the fired products are unfavorably porous.

$Al_2O_3$ powder to be added to the foregoing glass powder is allowed to contain impurities up to 10% as in the glass.

In preparing the ceramics of the present invention, as glass forming materials, CaO, $SiO_2$ and $Al_2O_3$ and, in the ceramics of the second invention, further $B_2O_3$ are mixed thoroughly to form the composition specified above, melted at a temperature of 1300° to 1450° C. and then quenched. The resulting glass was milled to fine powder. In the preparation of the glass, thermally decomposable compounds, such as carbonates or hydroxides which are converted to the oxides on heating can be used as raw materials as well as the oxides themselves. The firing temperature range to melt the materials is also desirable from the standpoint of furnace materials or other points.

The resulting powdered glass is mixed with powdered alumina in the specified proportion. Then the mixed powders are fabricated into a desired shaped powder and then cast in a conventional manner, such as cold pressing or tape casting. The cast tape is fired at a temperature of 800° to 1000° C.

In the case where the ceramic composition of the present invention is used to make multilayer substrates, for example, Ag base conductors are printed onto the shaped green ceramic sheets and the required number of the ceramic sheets with the conductors are stacked in a multilayer configuration. Then, the green ceramics and the printed conductors are simultaneously fired to form a integrated multilayer structure. If necessary, through holes may be formed.

Also, resistor compositions, for example, $RuO_2$ or SiC resistor compositions, or various types of capacitor pastes, such as $BaTiO_3$, $SrTiO_3$, $Pb(Fe_{\frac{2}{3}}W_{\frac{1}{3}})O_3$-$Pb(Fe_{\frac{1}{2}}Nb_{\frac{1}{2}})O_3$ may be printed onto the green ceramic sheets by an ordinary method and the sheets are stacked into a multilayer structure and simultaneously fired to provide integrated multilayer substrates having resistors or capacitors therein. As further practice, green ceramic sheets made up of capacitor compositions and the green ceramic sheets of the present invention can be alternately stacked and simultaneously fired to provide integrated structures incorporating capacitors therein.

In a further practice, a conductor paste comprising powdered Cu having a controlled particle size and subjected to oxidation-resistance treatment is printed onto the green sheets and the green sheets with the printed conductor are stacked in a multilayer configuration. Thereafter, the multilayered ceramic sheets and the printed conductors are simultaneously fired in an atmosphere mainly consisting of $N_2$ to provide an integrated multilayer substrate interconnecting the Cu conductors therein. In this case, since the firing is conducted in an inert atmosphere of $N_2$, a multilayer substrate having the Cu conductors and resistors can be prepared using the Cu conductor paste and resistor pastes containing Ni-Cr, molybdenum silicide, W-Ni or other metallic compounds.

Now, the present invention will be described in detail with reference to the detailed examples which follow.

TABLE 1

| Specimen No. | Glass Composition used in Ceramic Composition (wt. %) | | | | | | Ceramic Composition | |
|---|---|---|---|---|---|---|---|---|
| | CaO | $SiO_2$ | $Al_2O_3$ | Alkali component | Other Impurities | $B_2O_3$ (wt. %) *1 | Glass Powder (wt. %) | $Al_2O_3$ Powder (wt. %) |
| 1 | 20 | 70 | 10 | | | 20 | 60 | 40 |
| 2 | 10 | 70 | 20 | | | 20 | 60 | 40 |
| 3 | 30 | 65 | 5 | | | 10 | 60 | 40 |
| 4 | 15 | 65 | 20 | | | 20 | 60 | 40 |
| 5 | 23 | 62 | 15 | | | 0 | 65 | 35 |
| 6 | 23 | 62 | 15 | | | 5 | 65 | 35 |
| 7 | 23 | 62 | 15 | | | 5 | 60 | 40 |
| 8 | 23 | 62 | 15 | | | 10 | 55 | 45 |
| 9 | 23 | 62 | 15 | | | 20 | 65 | 35 |
| 10 | 23 | 62 | 15 | | | 20 | 55 | 45 |
| 11 | 23 | 62 | 15 | | | 20 | 50 | 50 |
| 12 | 23 | 60 | 5 | | | 10 | 60 | 40 |
| 13 | 25 | 60 | 15 | | | 10 | 60 | 40 |
| 14 | 20 | 60 | 20 | | | 10 | 60 | 40 |
| 15 | 24 | 59 | 15 | 2 | | 10 | 60 | 40 |
| 16 | 23 | 59 | 13 | 2 | 3 | 9 | 60 | 40 |
| 17 | 24 | 57 | 14 | 5 | | 10 | 60 | 40 |
| 18 | 10 | 60 | 30 | | | 20 | 60 | 40 |
| 19 | 35 | 55 | 10 | | | 10 | 60 | 40 |
| 20 | 35 | 55 | 10 | | | 10 | 50 | 50 |
| 21 | 15 | 55 | 30 | | | 10 | 60 | 40 |
| 22 | 50 | 50 | | | | 10 | 55 | 45 |
| 23 | 50 | 50 | | | | 10 | 50 | 50 |
| 24 | 40 | 50 | 10 | | | 10 | 60 | 40 |
| 25 | 40 | 50 | 10 | | | 10 | 50 | 50 |
| 26 | 35 | 45 | 20 | | | 10 | 60 | 40 |
| 27 | 20 | 50 | 30 | | | 10 | 60 | 40 |
| 28 | 19 | 48 | 28 | 5 | | 10 | 60 | 40 |
| 29 | 20 | 75 | 5 | | | 20 | could not be fritted | |
| 30 | 5 | 70 | 25 | | | 20 | 60 | 40 |
| 31 | 23 | 62 | 15 | | | 25 | 60 | 40 |
| 32 | 25 | 60 | 15 | | | 10 | 45 | 55 |
| 33 | 25 | 60 | 15 | | | 10 | 40 | 60 |
| 34 | 25 | 60 | 15 | | | 10 | 70 | 30 |

TABLE 1-continued

| | Glass Composition used in Ceramic Composition (wt. %) | | | | | | Ceramic Composition | |
|---|---|---|---|---|---|---|---|---|
| Specimen No. | CaO | SiO$_2$ | Al$_2$O$_3$ | Alkali component | Other Impurities | B$_2$O$_3$ (wt. %) *1 | Glass Powder (wt. %) | Al$_2$O$_3$ Powder (wt. %) |
| 35 | 15 | 50 | 35 | | | 20 | could not be fritted | |

*1 Weight percentage based on the total weight of each glass except B$_2$O$_3$.

TABLE 2

| Specimen No. | Firing Temp. (°C.) | Flexural Strength (kg/cm$^2$) | Thermal Exp. Coeff. × 10$^{-6}$/°C. *2 | Dielectric Constant ε (1 MHz) | tan δ (× 10$^{-4}$ 1 MHz) | Volume Resistivity (Ω · cm) | Bulk Density (g/cc) | Porosity (%) |
|---|---|---|---|---|---|---|---|---|
| 1 | 1000 | 1700 | 4.8 | 6.7 | 2 | >10$^{14}$ | 2.8 | 0 |
| 2 | 1000 | 2000 | 4.9 | 6.6 | 3 | >10$^{14}$ | 2.9 | 0 |
| 3 | 900 | 2100 | 5.5 | 7.7 | 3 | >10$^{14}$ | 2.9 | 0 |
| 4 | 1000 | 2100 | 4.9 | 7.0 | 3 | >10$^{14}$ | 2.9 | 0 |
| 5 | 1000 | 2700 | 6.0 | 7.8 | 4 | >10$^{14}$ | 2.9 | 0 |
| 6 | 950 | 2000 | 5.7 | 7.5 | 2 | >10$^{14}$ | 2.9 | 0 |
| 7 | 950 | 2300 | 5.5 | 7.5 | 2 | >10$^{14}$ | 2.9 | 0 |
| 8 | 900 | 2100 | 5.7 | 7.3 | 1 | >10$^{14}$ | 2.9 | 0 |
| 9 | 850 | 1700 | 5.2 | 6.8 | 5 | >10$^{14}$ | 2.8 | 0 |
| 10 | 850 | 2000 | 5.5 | 7.2 | 4 | >10$^{14}$ | 2.9 | 0 |
| 11 | 850 | 2000 | 5.3 | 7.3 | 5 | >10$^{14}$ | 3.0 | 0.2 |
| 12 | 850 | 1900 | 6.4 | 8.0 | 7 | >10$^{14}$ | 3.0 | 0 |
| 13 | 900 | 2100 | 5.5 | 7.7 | 3 | >10$^{14}$ | 2.9 | 0 |
| 14 | 900 | 2400 | 5.3 | 7.8 | 4 | >10$^{14}$ | 2.9 | 0 |
| 15 | 850 | 2000 | 5.5 | 7.2 | 2 | >10$^{14}$ | 2.9 | 0 |
| 16 | 900 | 2100 | 5.6 | 7.5 | 5 | >10$^{14}$ | 3.0 | 0 |
| 17 | 850 | 2000 | 5.2 | 7.6 | 6 | >10$^{14}$ | 2.9 | 0 |
| 18 | 1000 | 2000 | 4.9 | 7.0 | 3 | >10$^{14}$ | 2.9 | 0 |
| 19 | 850 | 1900 | 6.5 | 8.3 | 5 | >10$^{14}$ | 3.1 | 0 |
| 20 | 900 | 2200 | 6.3 | 8.4 | 4 | >10$^{14}$ | 3.2 | 0.1 |
| 21 | 1000 | 1900 | 5.2 | 7.3 | 1 | >10$^{14}$ | 3.0 | 0 |
| 22 | 850 | 1900 | 6.8 | 8.7 | 4 | >10$^{14}$ | 3.1 | 0 |
| 23 | 850 | 2100 | 6.9 | 6.7 | 6 | >10$^{14}$ | 3.2 | 0.1 |
| 24 | 850 | 1900 | 6.9 | 8.6 | 9 | >10$^{14}$ | 3.1 | 0 |
| 25 | 850 | 2000 | 6.9 | 8.5 | 8 | >10$^{14}$ | 3.2 | 0 |
| 26 | 850 | 1900 | 6.8 | 8.4 | 6 | >10$^{14}$ | 3.0 | 0 |
| 27 | 950 | 2100 | 5.1 | 7.4 | 7 | >10$^{14}$ | 2.9 | 0 |
| 28 | 900 | 2100 | 5.2 | 7.3 | 6 | >10$^{14}$ | 2.9 | 0 |
| 29 | | | | | | | | |
| 30 | 1000 | | | Unsintered, porous fired body was obtained. | | | | |
| 31 | 850 | 1600 | 5.1 | 7.1 | 4 | 10$^{14}$ | 2.8 | 0 |
| 32 | 1000 | 1700 | | Unsintered, porous fired body was obtained. | | | | |
| 33 | 1000 | 1500 | | Unsintered, porous fired body was obtained. | | | | |
| 34 | 900 | 1600 | 5.4 | 7.0 | 2 | 10$^{14}$ | 2.8 | 0 |
| 35 | | | | | | | | |

*2 Thermal expansion coefficient was measured in the temperature range from room temperature to 250° C.

EXAMPLE 1

311 g of CaCO$_3$, 516 g of SiO$_2$ and 172 g of Al$_2$O$_3$ were thoroughly mixed and 147 g of H$_3$BO$_3$ was added to the mixture. After mixing by using a mill, the resulting powder mixture was melted at 1400° C. and poured in water. Then the prepared glass frit was milled in a ball mill.

600 g of the glass frit powder thus obtained and 400 g of Al$_2$O$_3$ were blended to form a dry powder mixture and a small amount of polyvinyl alcohol was added as a binder to the mixture. After pressing, the mixture was fired at 900° C. The properties of the resulting ceramic product are given as specimen No. 14 in Table 2.

EXAMPLE 2

877 g of CaCO$_3$, 1310 g of SiO$_2$ and 316 g of Al$_2$O$_3$ were intimately mixed together, melted at 1400° C. and then poured in water.

650 g of the glass frit thus obtained was mixed with 350 g of Al$_2$O$_3$ and milled to a dry powder mixture. 100 g of methacrylate type binder, 50 g of plasticizer (dioctyl adipate) and 280 g of solvent (toluene and xylene) were added to 1000 g of the dry powder mixture and shaped to a slip. The slip was formed to a 1.0 mm thick green sheet using a doctor blade and fired at 1000° C. The properties of the fired ceramic sheet product are shown as specimen No. 5 in Table 2.

EXAMPLE 3

316 g of CaCO$_3$, 416 g of SiO$_2$, 102 g of Al$_2$O$_3$, 20 g of Na$_2$O, 10 g of K$_2$O and 6 g of Li$_2$O were uniformly mixed and then 130 g of H$_3$BO$_3$ was mixed using a mill. The resulting glass forming powdered material was melted at 1400° C. and poured in water. After forming glass frit, 600 g of the frit was intimately mixed with 400 g of Al$_2$O$_3$ and milled to provide a dry powdered mixture.

Then, this dry powdered mixture was mixed with a suitable amount of methyl cellulose and a small amount of water, shaped into a columnar body with a diameter of 10 mm by extrusion and fired at 850° C. The properties of the ceramic product (specimen No. 17) are indicated in Table 2.

EXAMPLE 4

Kaolin, siliceous sand, calcium silicate and boric acid were mixed in the controlled proportion to give a total amount of 1000 g, melted at 1400° C. and thereafter poured in water. The composition of the resulting glass frit is shown in Table 1, specimen No. 16. The glass frit contained 0.8% of MgO, 0.4% of BaO, 0.5% of PbO, 1.3% of $Fe_2O_3$, 1.3% of $Na_2O$ and 0.7% of $K_2O$ as impurities based on the total weight of the glass-forming components except $B_2O_3$.

600 g of the frit and 400 g of solid solution powder composed of 90% of $Al_2O_3$ and 10% of $Cr_2O_3$ were thoroughly mixed together to a dry powder mixture.

To 100 g of the dry powder mixture, 20 g of polyethylene and, as a platicizer, 5 g of sorbitan stearate were added and admixed. The mixture was heated to melt the polyethylene and shaped by injection molding. The shaped body was fired at 900° C. and the ceramic product obtained therefrom exhibits the properties given as specimen No. 16 in Table 2.

Similarly, other various ceramic products of the present invention and comparative examples (specimen Nos. 29 to 35) were produced in the same way as previously above except that their compositions were changed as shown in Table 1 and their properties are given in Table 2.

As is clear from the results given in Table 2, the ceramics of the present invention are superior in heat resistance and thereby can withstand a high temperature exposure of 800° to 1000° C. without causing detrimental effects. The fired ceramic products possess a lower thermal expansion coefficient of the order of $5 \times 10^{-6}$ to $7 \times 10^{-6}/°C$. Further, the ceramic products have a much higher mechanical strength and, thus, they are not subject to warpage, deformation, cracking and deterioration of electrical resistivity due to repeated heating cycles, for example, dip soldering.

Hereinafter, advantageous features of the ceramics of the present invention, especially advantages useful as circuit substrates, are listed.

(1) The ceramic substrate of the present invention exhibits a higher thermal conductivity of 0.01 cal/cm..sec.°C. which is 20 times as high as the thermal conductivities of conventional organic substrates, 0.0005 cal/cm.sec.°C. Since such much higher thermal conductivity allows heat generated in semiconductor IC chip or other passive elements on the substrate to readily radiate, the passive elements can be packaged on the ceramic substrate with a higher packing density.

(2) Since the thermal expansion coefficient of the ceramic substrate of the present invention is from $4.8 \times 10^{-6}$ to $7 \times 10^{-6}/°C$. and the value is considerably small in comparison with conventional organic or alumina multilayer substrate, LSI chip can be directly bonded to the substrate.

(3) The ceramic substrate of this invention has a very small dielectric constant of 6.5 to 9 ( at 1 MHz) and dielectric loss (tan$\delta$) of $10^{-4}$ to $10^{-3}$ as compared to an alumina substrate and the properties make possible a prompt response to a high frequency signal.

(4) Fine conductor patterns can be formed on the green ceramic sheet of the present invention and, after stacking 5 to 10 or more of the green ceramic sheets, simultaneously fired, thereby forming the fine conductor patterns in a three-dimensional configuration and a high density.

(5) Since the firing temperature of the green ceramic substrate is the lower temperature range of 800° to 1000 °C., they can be simultaneously fired together with resistors, capacitors or other passive elements thereon without any detrimental interaction with them, thereby providing an integrated multilayer structure having these passive elements, which can not be incorporated into any heretofore available organic or alumina multilayer substrate.

(6) The advantegeous feature of the low firing temperature substantially reduces the cost compared with conventional alumina multilayer substrates.

(7) Since the green ceramic sheets multilayered and circuit elements mounted thereon are fired at the same time to form an integrated structure, the fired product has a very high reliability in thermal and humidity stability.

(8) Since conductive materials with a low resistance, such as Ag, Cu or Au, can be applied to the ceramic substrates, the ceramic products can be produced in a high packing density and exhibit a shortpropagation delay.

(9) After the ceramic substrates multilayered and conductors or other elements formed thereon are integrated by simultaneously firing, different resistors and condutors (Ag, Au or Cu) can be formed onto the fired substrate by a conventional thick film formation technique.

(10) The ceramics have a very low small density of 2.7 to 3.2 $g/cm^3$ as compared to that of an alumina multilayer substrate and thereby facilitates the handling of them.

The advantageous or beneficial properties or effects set forth above are listed in Table 3 below in comparison with conventional multilayer organic and alumina substrates.

TABLE 3

| | Ceramic Substrate of the Present Invention | Organic Multilayer Substrate | Alumina Multilayer Substrate |
|---|---|---|---|
| Lightness of Weight | ⊙ | | Δ |
| Strength | ⊙ | Δ | |
| Thermal Conductivity | ⊙ | Δ | |
| Fine Pattern Forming Ability | | Δ | ⊙ |
| Multilayer Forming Ability | | Δ | ⊙ |
| Incorporation of Resistors or Conductors | | Δ | ⊙ |
| Dielectric Constant ε, tan δ | Small | Very Small | Large |
| Resistance of Conductor | Very Low (Ag) | Low (Cu) | High (W) |
| Thermal Expansion | Very Small | Large | Small |
| Electric Insulating Resistance | | Δ | |
| Environmental Stability | | Δ | |
| Cost | Cheap | Very Cheap | Expensive |

Note:
⊙ Best,
O Good or acceptable
Δ Bad or unacceptable (impractical)

As described previously, the ceramic products of the present invention have a superior combination of properties and have a good utility as low temperature fired ceramics in the various industrial fields, such as electronic parts or components, thermal resistant articles, tablewares, kitchen utensiles and decorative articles. Further, since the ceramic compositions of the present invention provide the fired products by firing at lower temperature and in a shortened firing time, the production cost and time can be significantly saved.

What is claimed is:

1. A partially crystallized ceramic article which has been prepared by firing at a temperature of from 800° to 1000° C., a mixture consisting essentially of, in weight percentages:
   (a) 50 to 65% of powdered, noncrystalline, glass consisting of
      10 to 55% of CaO,
      45 to 70% of $SiO_2$,
      0 to 30% of $Al_2O_3$, and up to 10% of impurities; and
   (b) 50 to 35% of powdered $Al_2O_3$ containing up to 10% of impurities.

2. A partially crystallized ceramic article as claimed in claim 1 and having the properties:
   (i) a thermal expansion coefficent of from $4.8 \times 10^{-6}$ to $7 \times 10^{-6}/°C.$,
   (ii) a dielectric constant of 6.5 to 9, at 1 MHz, and
   (iii) a density of 2.7 to 3.2 $g/cm^3$.

3. A partially crystaliized ceramic article as claimed in claim 1 which consists essentially of a noncrystallized glass phase, alumina and a crystallized phase of anorthite or anorthite plus calcium silicate formed by partial crystallization of glass (a).

4. A partially crystallized ceramic article as claimed in claim 1 in which said powdered, noncrystalline glass (a) was prepared by melting CaO, $SiO_2$ and $Al_2O_3$, or their corresponding carbonates or hydroxides, at a temperature of 1300° to 1450° C., to form molten glass then pouring the molten glass into water to obtain glass frit and then milling the glass frit to obtain the glass (a).

5. A partially crystallized ceramic article which has been prepared by firing at a temperature of from 800° to 1000° C., a mixture consisting essentially of, in weight percentages:
   (a) 50 to 65% of powdered, noncrystalline, glass consisting of
      (i)
         10 to 55% of CaO,
         45 to 70% of $SiO_2$,
         0 to 30% of $Al_2O_3$,
         and up to 10% of impurities; and
      (ii) up to 20% of $B_2O_3$, based on the total weight of (i); and
   (b) 50 to 35% $Al_2O_3$ containing up to 10% of impurities.

6. A partially crystallized ceramic article as claimed in claim 5 and having the properties:
   (i) a thermal expansion coefficent of from $4.8 \times 10^{-6}$ to $7 \times 10^{-6}/°C.$,
   (ii) a dielectric constant of 6.5 to 9, at 1 MHz, and
   (iii) a density of 2.7 to 3.2 $g/cm^3$.

7. A partially crystallized ceramic article as claimed in claim 5 which consists essentially of a noncrystallized glass phase, alumina and a crystallized phase of anorthite or anorthite plus calcium silicate formed by partial crystallization of glass (a).

8. A paritally crystallized ceramic article as claimed in claim 5 in which said powdered, noncrystalline glass (a) was prepared by melting CaO, $SiO_2$, $Al_2O_3$ and $B_2O_3$, or their corresponding carbonates or hydroxides, at a temperature of 1300° to 1450° C., to form molten glass then pouring the molten glass into water to obtain glass frit and then milling the glass frit to obtain the glass (a).

* * * * *